United States Patent [19]

Farnbach

[11] 4,100,532
[45] Jul. 11, 1978

[54] DIGITAL PATTERN TRIGGERING CIRCUIT

[75] Inventor: William A. Farnbach, Colorado Springs, Colo.

[73] Assignee: Hewlett-Packard Company, Palo Alto, Calif.

[21] Appl. No.: 743,188

[22] Filed: Nov. 19, 1976

[51] Int. Cl.² .............................................. G06K 9/00
[52] U.S. Cl. ...................... 340/146.3 MA; 324/73 R; 340/146.2; 364/481
[58] Field of Search ............. 340/146.3 MA, 146.3 Q, 340/146.2, 173 AM; 235/177; 310/8.2, 8.3, 8.7, 9.1; 307/269; 315/379, 380; 324/183, 83 R, 83 D, 88, 28 SE, 73 R, 73 AT, 73 PC

[56] References Cited

U.S. PATENT DOCUMENTS

| | | | |
|---|---|---|---|
| 3,448,436 | 6/1969 | Machol, Jr. | 340/146.2 |
| 3,613,082 | 10/1971 | Bouchard | 340/146.2 |
| 3,832,685 | 8/1974 | Hendrickson | 340/146.2 |
| 4,003,024 | 1/1977 | Riganati et al. | 340/146.3 MA |

Primary Examiner—Leo H. Boudreau
Attorney, Agent, or Firm—Michael L. Sherrard

[57] ABSTRACT

A digital pattern triggering circuit combines an addressable memory and a processor. Input data patterns address corresponding memory elements whereby data previously stored in the memory by the processor is accessed, providing an indication of whether a preselected data pattern has occurred.

12 Claims, 4 Drawing Figures

DIGITAL PATTERN TRIGGERING CIRCUIT

BACKGROUND AND SUMMARY

In instruments such as Oscilloscopes, Logic State Analyzers and Logic Timing Analyzers, used to monitor digital signals, it is desirable to start the display or storage function when a particular data pattern, or "trigger word" occurs. Typically, pattern comparators are constructed with logic gates and three position switches. Each input channel has one switch that corresponds to the channel and each switch may be set to one of three states: high, or one, so that a trigger can only be generated if the input that corresponds to that switch is in the high voltage state: low, or O, so that a trigger can only be generated if the input that corresponds to that switch is in the low voltage state: or off, or "don't care", so that a trigger can be generated regardless of this state of the input that corresponds to that switch. Such a triggering scheme is described in U.S. Pat. No. 3,843,898 entitled LOGICAL SYNCHRONIZATION OF TEST INSTRUMENTS issued to Frank Duncan Terry, Oct. 22, 1974.

The current invention combines certain logic arithmetic elements, a memory, and a processor to enable triggering from the detection of any trigger pattern corresponding to a selected set or a selected range of trigger patterns.

DESCRIPTION OF THE PREFERRED EMBODIMENT

Figure 1:
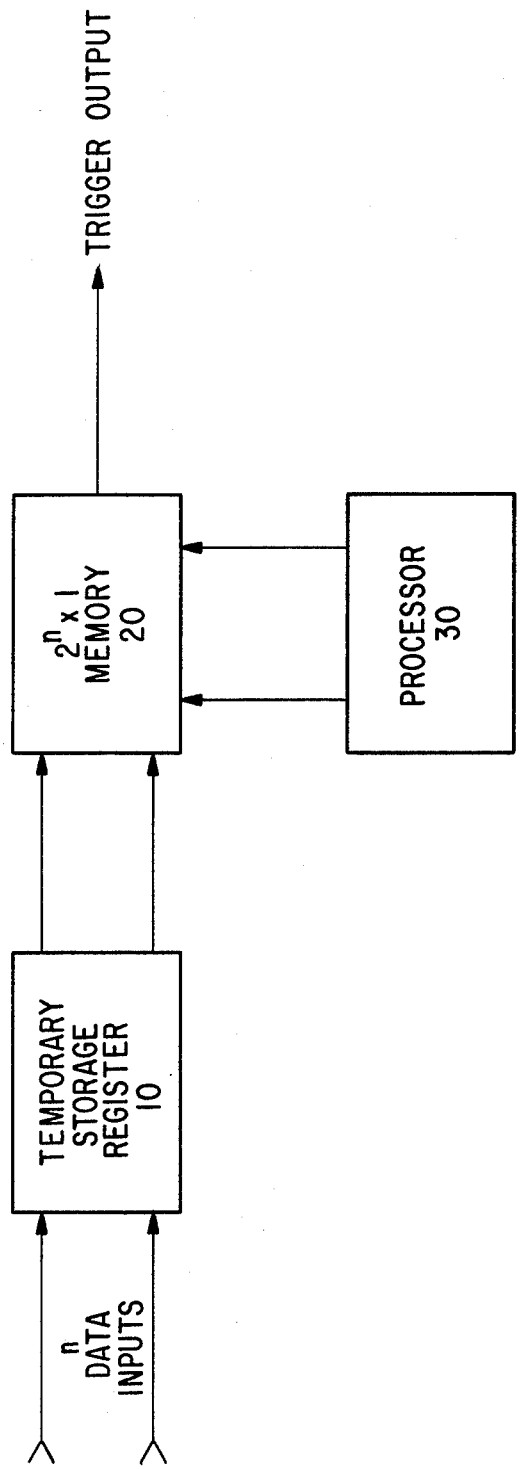
FIG. 1 is a block diagram of a first embodiment of the present invention.

A first embodiment of the preferred invention is illustrated in FIG. 1. Memory 20 has $2^n$ storage locations where $n$ is the number of binary data inputs. Every possible data input pattern represents a unique address in memory. Processor 30 loads a 1 into every address that corresponds to an input pattern that should generate a trigger and a 0 into every address that corresponds to an input pattern that should not generate a trigger. Input data is stored into the temporary storage register 10, and each input pattern will address the data stored in the corresponding memory location which subsequently appears on the trigger output of the memory 20. Thus, the output will be true (1) if a 1 was previously stored in the corresponding memory location by processor 30. The set of patterns that will generate a trigger can be any subset of the $2^n$ possible data input patterns. This is a substantial increase in versatility over the present arrangement where each bit may be represented by only one switch in one of three positions.

Figure 2:
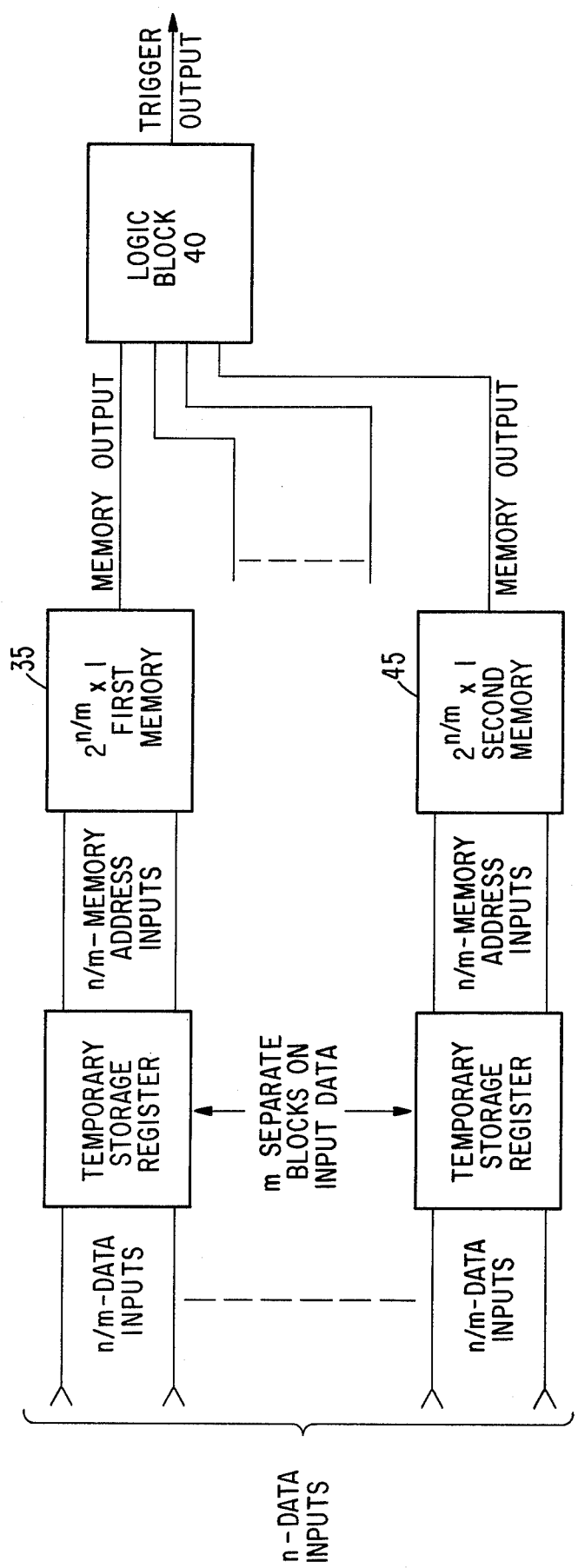
FIG. 2 is a block diagram of a second embodiment of the present invention.

The present invention may also be embodied in configurations requiring less than $2^n$ memory locations, where $n$ is the number of data inputs, at the expense of a certain amount of versatility. FIG. 2 shows a second embodiment of the present invention. In this embodiment, the data has been divided into separate blocks and the memory for each block is loaded as described in the preceeding circuit. For example, the desired 8-bit trigger pattern, 1001 0111 can be divided into two 4-bit blocks as 1001 and 0111. The first memory 35 is located with a false at every address except at 1001. The second memory 45 is loaded with a false at every address except 0111. If the memory outputs of the two memories are now ANDED in the logic block 40, then the trigger to the utilization circuit is true if and only input pattern is 1001 0111. With this arrangement, the amount of memory required is greatly reduced, for example, for 16 inputs only four 16 × 1 memories would be required. However, inputs may be combined arbitrarily only in blocks of four, with 16 word memories. Although the example above "ANDS" the memory outputs, other combinations may be useful. If the logic block 40 can also "OR" memory outputs, then a trigger can be generated when the input pattern does not match the prescribed input pattern. Using the input 1001 0111 again, the first memory is loaded with "1" at every location except 1001; the second is loaded with "1" at every location except 0111, and the memory outputs are "OR'ed". The trigger output will be true whenever the input is not 1001 0111 and false when it is.

Figure 3:
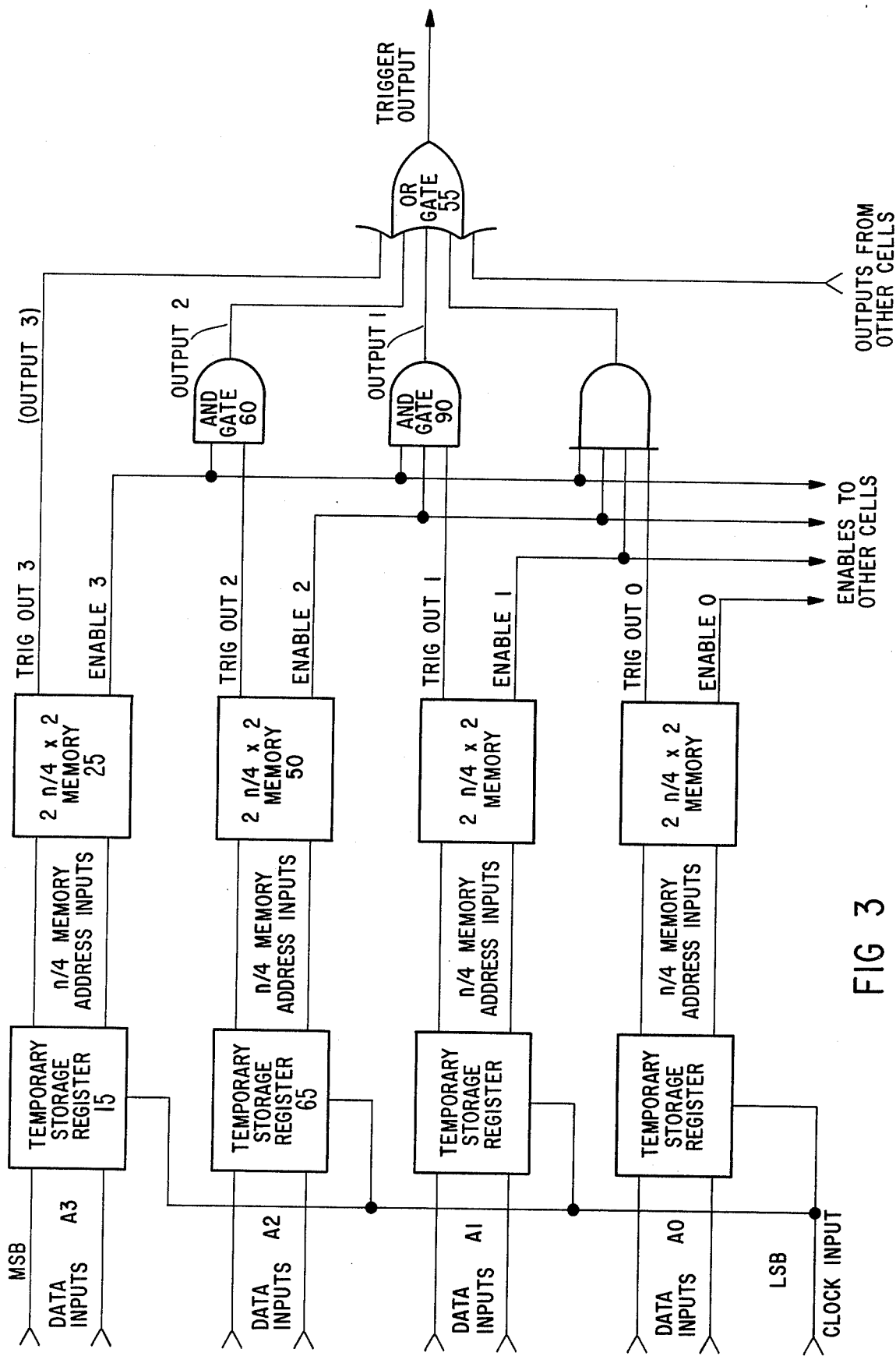
FIG. 3 is a block diagram of a comparator constructed in accordance with the present invention.

In many digital machines, a least part of the data is considered to be numeric. For example, program addresses are assigned a numerical value or a binary weighted code. Thus, a subroutine may run from address $137_8$ to $243_8$. It is desirable to be able to generate a trigger whenever program execution enters the subroutine. Conversely, it would also be desirable to be able to generate a trigger whenever $137_8 >$ the program address or $243_8 <$ the program address; that is, whenever program execution leaves the subroutine, a trigger is generated. To perform this trigger function, two arithmetic comparators must be constructed. FIG. 3 is a block diagram of one arithmetic comparator constructed in accordance with the preferred embodiment.

The comparator of FIG. 3 shows the input data A grouped into four blocks: A3, A2, A1 and A0, where A3 is the most significant block and A0 is the least significant block. Likewise, a reference value, M, is divided into four groups: M3, M2, M1 and M0, with M3 the most significant group and M0 the least significant group. The circuit illustrated in FIG. 3 would generate an output trigger signal whenever the value of the input data, A, is greater than the value of the reference value, M. The most significant input data block, A3, is loaded into temporary storage register 15. Memory 25 has two locations for each possible input data block. The processor, not shown, will load a 1 into each of the first set of memory locations in locations corresponding to addresses which are numerically larger than the reference value M3. The processor will also load a logical 1 into the memory location in the second set of memory locations at the memory location corresponding to the numerical value of the reference value M3. A first output labeled trigger output 3 from memory 25 is connected to the first set of memory locations. A second output from memory 25, designated enable 3, is connected to the second set of memory locations in memory 25. If the input data block A3 is greater than the reference value block M3, the trigger out 3 output from memory 20 will be a logical 1, which will cause a trigger output to be generated by the OR GATE 55. If the input data block A3 is numerical equal to the reference value M3, an enable 3 signal will be generated by memory 25 which will enable the AND GATE 60. The next most significant input data block A2 is input to temporary storage register 65. Memory 50 has been loaded by the processor to contain data similar in format to that contained in memory 25, except that the numerical values correspond to the reference value M2. The input data block A2 is greater than the reference value M2, a trigger out two signal will be generated from memory 50. If an enable 3 signal has also been generated by memory 25, the AND GATE 60 will output a signal, output 2, which will be input to the OR GATE 55 resulting in trigger output being generated by the circuit. If the input data block A2 is equal to the reference value M2 stored in memory 50, an enable 2 signal will be generated which will enable the AND GATE 90 if an enable 3 signal has also been output by memory 25. The operation of the temporary storage registers, memories and AND GATES for the sequential data inputs associated with the less significant blocks is identical to the operation described for the most significant blocks. Of course the circuit can be utilized to implement a "greater than or equal to" condition by simply ANDING the outputs of the final memory or using a memory having only one storage location for each possible input value for the least significant data input block.

Figure 4:
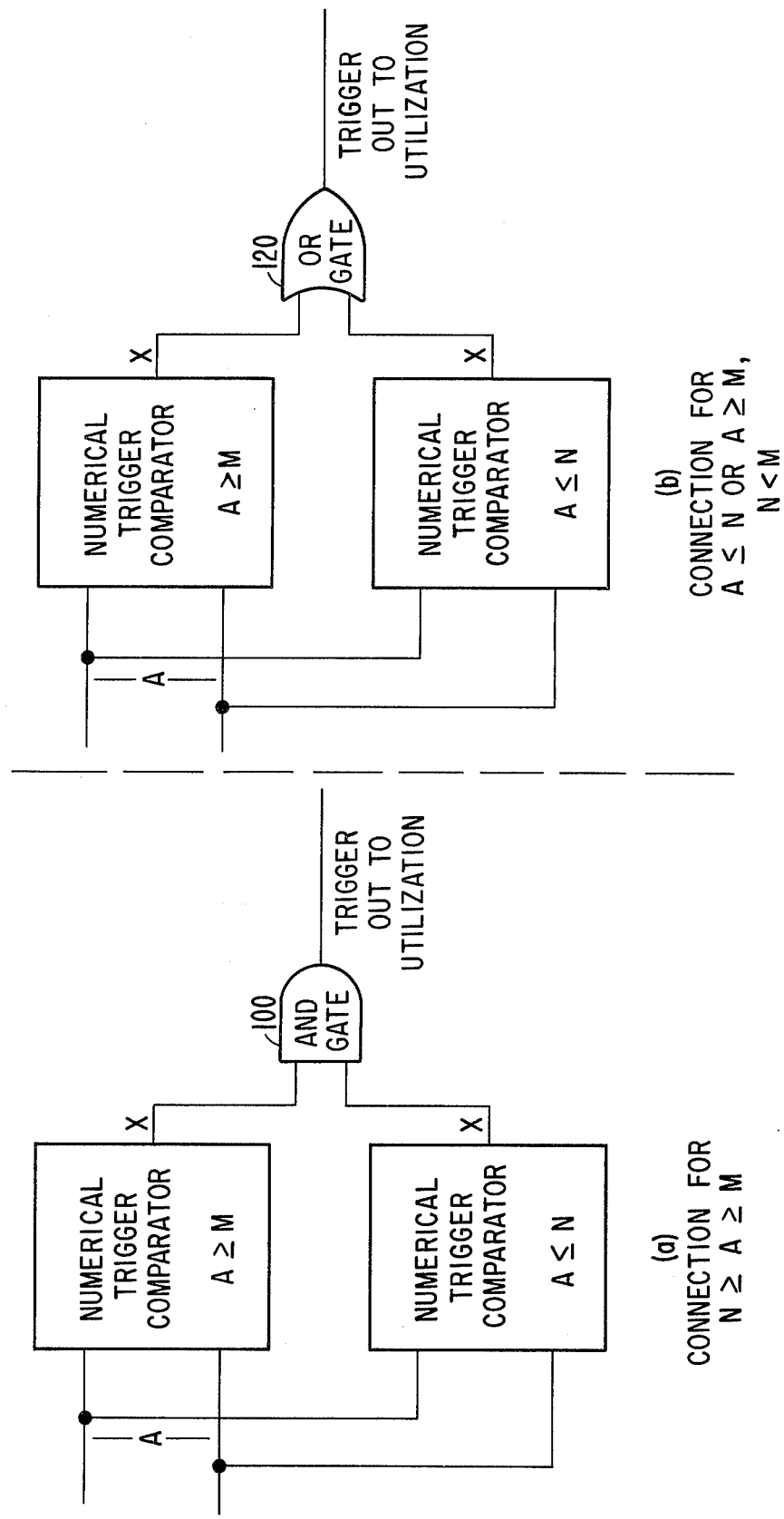
FIG. 4 is a block diagram showing two combinations of the comparator of FIG. 3 in accordance with the present invention.

A second arithmetic comparator is constructed in accordance with the above described invention by loading 1's in the first set of storage locations corresponding to reference values numerically less than the values of the corresponding reference value blocks. FIG. 4 shows the combination of the numerical comparators in two different configurations. The first configuration corresponding to FIG. 4A shows the outputs of the first and second numerical comparators ANDED by AND GATE 100. This conveniently implements the logic where triggering is requested for any input data having a numerically value < and > certain reference values. In FIG. 4B the outputs of two numerical comparators are OR'ed by OR GATE 120. This configuration conveniently implements the logic where a trigger is desired when the input data is > or < certain reference values.

I claim:

1. A range detector for operation upon a digital signal represented by a combination of bytes, the detector comprising:
   first and second memory means, said first and second memory means coupled to receive a byte corresponding to the most significant bits and the next most significant bits of the digital signal respectively, each means having a loading input, a trigger output, an enable output, and two sets of storage elements, each element capable of storing a first or second value, each memory means applying signals to the trigger output and the enable output representative of the values of storage elements selected from the first and second sets respectively in response to the byte received at the input thereof;
   coupling means having a first input coupled to receive the enable output of said first memory means, a second input coupled to receive the trigger output of said second memory means and a trigger output for producing an output signal upon detection of signals representative of the first value upon both inputs;
   output means with a first input coupled to receive the trigger output of said first memory means, a second input coupled to receive the trigger output of said coupling means, and a trigger output for generating an output signal upon the detection of an input signal representative of the first value upon an input; and
   means coupled to the loading inputs of said first and second memory means for storing selected values into selected storage elements.

2. A triggering circuit comprising two range detectors as described in claim 1 with the trigger outputs thereof applied to the inputs of a logic element capable of producing an output upon the detection of a signal upon both inputs.

3. A triggering circuit comprising two range detectors as described in claim 1 with the trigger outputs thereof applied to the inputs of a logic element capable of producing an output upon the detection of a signal upon either input.

4. A logic analyzer of the type having storage means for storing a sample of a digital data signal in response to a trigger signal, said logic analyzer further comprising a range detector as in claim 1 wherein the output signal generated by said output means is the trigger signal.

5. A range triggering circuit for operating upon a multichannel digital signal, the circuit comprising:
   first memory means coupled to receive a first subset of the digital signal channels corresponding to the most significant bits of the digital signal, having two sets of addressable memory locations with a distinct memory location in each set associated with each possible binary combination of the signals appearing on the channels received, each memory location capable of storing a first or a second value, for producing a first output representative of the pre-stored value contained in a memory location of the first set addressed by the digital signal channels received, and for producing a second output representative of a pre-stored value containing a storage element of the second set addressed by the digital signal channels received;
   second memory means coupled to receive a subset of the digital signal channels corresponding to the next most significant bits of the digital signal, having two sets of addressable memory locations with a distinct memory location in each set associated with each possible binary combination of the signals appearing on the channels received, for producing a first output representative of a pre-stored value contained in a storage location of the first set addressed by the digital signal channels received, each memory location capable of storing a first or a second value, and for producing a second output representative of a pre-stored value contained in a storage element of the second set addressed by the digital signal channels received;
   coupling means for producing a first signal in response to the second output of the first memory means and the first output of said second memory means attaining a first value; and
   output means for producing a trigger signal if either the first output of said first memory means or the first signal has a first value.

6. A circuit as in claim 5 further comprising loading means for pre-storing a first value into the memory locations of the first set of said first memory means associated with addresses numerically greater than a selectable reference value and for pre-storing a first value into a memory location of the second set associated with the address numerically equal to the selected reference value.

7. A circuit as in claim 5 further comprising loading means for pre-storing a first value into the memory locations of the first set of said first memory means associated with addresses numerically less than a selectable reference value and for pre-storing a first value into a memory location of the second set associated with the address numerically equal to the selected reference value.

8. A triggering circuit comprising two range detectors as described in claim 5 with the trigger outputs thereof applied to the inputs of a logic element capable of producing an output upon the detection of a signal upon both inputs.

9. A triggering circuit comprising two range detectors as described in claim 5 with the trigger outputs thereof applied to the inputs of a logic element capable of producing an output upon the detection of a signal upon either input.

10. A logic analyzer of the type having storage means for storing a sample of a digital data signal in response to a trigger signal, said logic analyzer further comprising a range detector as in claim 5 wherein the output signal generated by said output means is the trigger signal.

11. A triggering circuit for operating upon a multi-channel digital signal, the circuit comprising:
first memory means coupled to receive a first subset of the digital channels corresponding to the most significant bits of the digital signal, having addressable memory locations with a distinct memory location associated with each possible binary combination of the signals appearing on the channels received, each memory location capable of storing a first or a second value, for producing a first output representative of a pre-stored value contained in a memory location addressed by the digital signal channels received;

second memory means coupled to receive a second subset of the digital signal channels corresponding to the least significant bits of the digital signal, having addressable memory locations with a distinct memory location associated with each possible binary combination of the signals appearing on the channels received, each memory location capable of storing a first or a second value, for producing a second output representative of a pre-stored value contained in a memory location addressed by the digital signal channels received;

coupling means for producing a trigger signal in response to the first and a second outputs attaining the first value; and means coupled to said first and second memory means for storing selected values into selected memory locations.

12. A logic analyzer of the type having storage means for storing a sample of a digital data signal in response to a trigger signal, said logic analyzer further comprising a triggering circuit as in claim 11.

* * * * *

UNITED STATES PATENT AND TRADEMARK OFFICE
CERTIFICATE OF CORRECTION

PATENT NO.   :   4,100,532
DATED        :   July 11, 1978
INVENTOR(S)  :   William A. Farnbach It is certified that error appears in the above-identified patent and that said Letters Patent are hereby corrected as shown below:

Column 1, line 21, cancel "3,843,898" and substitute -- 3,843,893 --;

Column 5, lines 9 and 10, cancel "two range detectors" and substitute -- two range triggering circuits --;

Column 5, lines 14 and 15, cancel "two range detectors" and substitute -- two range triggering circuits --.

Signed and Sealed this

First Day of April 1980

[SEAL]

Attest:

SIDNEY A. DIAMOND

Attesting Officer

Commissioner of Patents and Trademarks